(12) United States Patent
Schwabe et al.

(10) Patent No.: US 11,575,322 B2
(45) Date of Patent: Feb. 7, 2023

(54) ELECTRICAL POWER CONVERTER

(71) Applicant: Infineon Technologies Austria AG, Villach (AT)

(72) Inventors: Benjamin L. Schwabe, Munich (DE); Jens A. Ejury, Fremont, CA (US); Sandro Cerato, Taufkirchen (DE)

(73) Assignee: Infineon Technologies Austria AG, Villach (AT)

( * ) Notice: Subject to any disclaimer, the term of this patent is extended or adjusted under 35 U.S.C. 154(b) by 263 days.

(21) Appl. No.: 16/865,701

(22) Filed: May 4, 2020

(65) Prior Publication Data

US 2020/0266706 A1 Aug. 20, 2020

Related U.S. Application Data

(63) Continuation of application No. 16/217,554, filed on Dec. 12, 2018, now Pat. No. 10,700,605.

(51) Int. Cl.

| | |
|---|---|
| *H02M 3/157* | (2006.01) |
| *H02M 3/158* | (2006.01) |
| *G06N 20/00* | (2019.01) |
| *H03K 7/08* | (2006.01) |
| *G06F 1/26* | (2006.01) |
| *H02M 1/00* | (2006.01) |

(52) U.S. Cl.
CPC ............ *H02M 3/1584* (2013.01); *G06F 1/26* (2013.01); *G06N 20/00* (2019.01); *H02M 3/157* (2013.01); *H03K 7/08* (2013.01); *H02M 1/0012* (2021.05)

(58) Field of Classification Search
CPC ...... H02M 1/0012; H02M 3/157; H03K 7/08; G06N 20/00; G06F 1/26
See application file for complete search history.

(56) References Cited

U.S. PATENT DOCUMENTS

| | | | |
|---|---|---|---|
| 4,630,187 A | 12/1986 | Henze | |
| 8,975,831 B1 | 3/2015 | Szolusha | |
| 9,007,043 B2 | 4/2015 | Sreenivas | |
| 9,082,079 B1 | 7/2015 | Coenen | |

(Continued)

FOREIGN PATENT DOCUMENTS

| | | |
|---|---|---|
| CN | 101286702 A | 10/2008 |
| CN | 101917118 A | 12/2010 |
| CN | 102902203 A | 1/2013 |
| CN | 104570729 A | 4/2015 |
| CN | 105867138 A | 8/2016 |
| EP | 0104845 A2 | 4/1984 |

OTHER PUBLICATIONS

Erickson, et al., Fundamentals of Power Electronics Second Editiion ,2004 Kluwer Academic Publishers, New York, Boston Dordrecht, London, Moscow, Jan. 1, 2007, XP055462444, pp. 1-881.

(Continued)

*Primary Examiner* — Jue Zhang
(74) *Attorney, Agent, or Firm* — Armis IP Law, LLC

(57) ABSTRACT

A power converter comprises a regulator, a value-supply system arranged for collecting at least one operating point of the power converter, and a predictor operative to produce updated regulator parameters (such as one or more power supply coefficients) implemented by the regulator to produce an output voltage to power a load. The updated regulator parameters are determined using a process based on the at least one collected operating point samples and predictor parameters obtained from a machine-learning process.

33 Claims, 8 Drawing Sheets

(56) References Cited

U.S. PATENT DOCUMENTS

| | | |
|---|---|---|
| 2005/0221514 A1 | 10/2005 | Pasadyn et al. |
| 2007/0185590 A1 | 8/2007 | Reindel et al. |
| 2007/0290672 A1 | 12/2007 | Worsley |
| 2011/0072186 A1 | 3/2011 | Cheng |
| 2014/0375375 A1 | 12/2014 | Horvat |
| 2017/0227937 A1 | 8/2017 | Batliner et al. |
| 2017/0302171 A1 | 10/2017 | Goto |
| 2018/0163691 A1 | 6/2018 | Abdelkhalik |
| 2019/0207517 A1 | 7/2019 | Karisson |
| 2020/0373836 A1* | 11/2020 | Nagato ................. H02M 3/157 |

OTHER PUBLICATIONS

Maruta, et al., "Transient Characteristics of DC-DC Converter with PID Parameter Selection and Neural network Control", XP-002798722, Dec. 3, 2014, 2014 13th International Conference on Machine Learning and Applications, pp. 447-452.

Office Action, EP Application No. 19 215 254.4, dated May 3, 2021, pp. 1-6.

Tanka, et ai., "A Sample-based Approach to Lookup Table Construction by SVM Active Learning", Jan. 1, 2005, 2005 IEEE International Conference on Robotics and Biomimetics, pp. 628-633.

Tanaka, et al, "A Sample-based Approach to Lookup Table Construction by SVM Active Learning" Jan. 1, 2005, pp. 628-633, 2005 IEEE International Conference on Robotics and Biomimetics, Robio Shatin, N.T. China Jul. 5, 2005, Piscataway, NJ, USA, IEEE, XP031001645.

Maruta, et al. "Transient Characteristics of DC-DC Converter with PID Parameter Selection and Neural network Control", Dec. 3, 2014, pp. 447-452, 2014 13th International Conference On Machine Learning and Applications, ICMLA 2014, XP002798722, Institute of Electrical and Electronics Engineers Inc. USA.

EP Search Report, EP 19 21 5254, May 6, 2020, pp. 9.

* cited by examiner

ELECTRICAL POWER CONVERTER

RELATED APPLICATION

This application is a continuation application of earlier filed U.S. patent application Ser. No. 16/217,554 entitled "ELECTRICAL POWER CONVERTER," (2018P51342US, filed on Dec. 12, 2018, the entire teachings of which are incorporated herein by this reference.

BACKGROUND

Electrical power converters, in particular DC-DC power converters, are widely used because of their high efficiency and small size. Among them, multiphase DC-DC power converters are particularly well suited for providing high currents at low voltages, as this is needed by highly integrated electronic components such as microprocessors, graphic processors, network processors, etc.

In a general manner, a multiphase power converter typically includes several converter branches which are called phases. The phases are connected in parallel for supplying a common load with respective phase currents. Thus, the output current which is supplied by the multiphase converter to the load is the sum of the phase currents. Any electrical power converter can be considered as comprising at least one phase, thus including single-phase power converters and multiphase power converters.

A single-phase power converter or each phase of a multiphase converter can be controlled via a proportional-integral-derivative (PID) regulator. In general, the PID controller controls the operations of switching devices that are arranged for supplying electrical charge or current to an energy tank circuit, i.e. a capacitor or an inductor, as well as for allowing the phase output current to flow from this energy tank to the load. $k_p$-, $k_i$- and $k_d$-coefficients which are implemented in the PID regulator are selected for producing the desired values for the output current and output voltage. Then, it is also known to adjust in real time respective values of the $k_p$-, $k_i$- and $k_d$-coefficients of each PID regulator as a function of values of, e.g., an input current and/or an input voltage of the converter, and also the values of the converter output current and/or output voltage.

Depending on a respective power converter design, the regulator used for controlling the operation of each phase may be of PID-type as just mentioned, but alternatively of any other type, including proportional type only, integral type, derivative type, any combination such as proportional-integral, integral-derivative and proportional-derivative, regulators which implement at least one higher order component for controlling the power conversion, delta-regulators, delta-sigma regulators, differential regulators, etc.

Recent generations of processors such as CPUs or GPUs have power-saving functions that causes power supply demand to vary over time in an unpredictable manner. In such an instance, a respective DC-DC power converter needs to perform well for a large variety of load profiles. In particular, such power converters have to meet stable regulation requirements over a wide output range and also meet specifications about transient load profiles, including short transition times and large load steps. Similar requirements apply to power converters used for power-supplying circuits which have power demands that vary randomly over time, such as VR controllers.

In addition, passive components such as output capacitors and inductors may exhibit significant variations which also need to be taken into account for optimizing the operation of a power converter. Such variations may relate to deviations with respect to target component values as resulting from the manufacture of each component, or may be due to aging of each component. But such variations may not be known initially when designing the adjustments of parameters that are implemented in the regulator of the power converter, such as $k_p$-, $k_i$- and $k_d$-coefficients in case of a PID regulator.

BRIEF DESCRIPTION OF EMBODIMENTS

First aspect of embodiments herein proposes a power converter, which is configured for conversion of an input current and an input voltage into an output current and an output voltage. The power converter includes at least one phase and further comprises:

a regulator operative to generate at least one control signal using at least one regulator parameter implemented in the regulator, the regulator being connected so that the at least one control signal is used by the power converter for producing the conversion;

a value-supply system arranged for collecting at least one operating point of the power converter, each operating point relating to an instant of operation of the converter and comprising on the one hand measured values for the instant of operation, for one or more input parameters among the input current, the input voltage, a phase input current, a phase input voltage, and/or for one or more output parameters among the output current, the output voltage, a phase output current, a phase output voltage, and on the other hand at least one value of a target output voltage for the power converter assigned to the instant of the operating point; and a predictor operative to provide a respective updated value for each regulator parameter, for further implementation by the regulator.

According to further embodiments herein, the predictor is configured to determine each updated regulator parameter value using a process based on the at least one operating point collected by the value-supply system and also based on predictor parameters that are obtained from a machine-learning process.

Hence, embodiments herein include implementing a further level for optimizing the operation of the power converter, by adapting the parameters of the regulator, i.e. the $k_p$- (proportional), $k_i$- (integral) and $k_d$- (derivative) coefficients in case of a PID regulator, in addition to the conversion control signals being adapted by the regulator.

Because the updated values of the regulator parameters are determined from measured values for at least one input parameter and/or at least one output parameter, and possibly additional measured values, actual values of passive components involved as well as actual conditions of the input power supply of the converter and of the converter load are taken into account for the operation optimization. In addition, when these conditions are changing over time, the chained operation of the value-supply system and the predictor allows modifying automatically and repeatedly the regulator parameters for fitting them onto the new conditions. In particular, implementing a machine-learning process for updating the regulator parameter values allows improved fitting of these values over a wide range of operating schemes for the load.

Implementing a machine-learning process as described herein also allows optimizing the operation of the power converter while taking into account variations that may exist in the passive component values due to their manufacturing process, without necessity for measuring each passive component used.

It also allows optimizing the operation of the power converter by taking into account any drift that may occur for the values of passive components used in the converter or in the load, including such drifts due to temperature variations for example.

In accordance with further embodiments, a value measured for at least one converter temperature may be collected additionally by the value-supply system and supplied to the predictor, so that the predictor also uses each measured temperature for determining the updated value of each regulator parameter.

In case of a multiphase power converter, comprising a plurality of phases for supplying the load with a total output current and a total output voltage resulting from phase output currents and phase output voltages respectively supplied by one of the phases, the input parameters used for each operating point may include several of the phase input currents and phase input voltages, and the output parameters used for each operating point may include several of the phase output currents and phase output voltages. More accurate fitting of the regulator parameter values onto the actual operating conditions of the power converter can be achieved in this way.

Preferably, the predictor may be adapted for providing the updated value of each regulator parameter based on a plurality of operating points which relate to successive instants of operation of the converter, the plurality corresponding to a fixed number of operating points. Put another way, the predictor may provide the updated regulator parameter values based on a history comprised of a fixed number of operating points. With such improvement, the predictor can optimize the operation of the power converter in a greater extent, in particular by anticipating changes to occur in the operation scheme of the load.

When the regulator parameter values are determined (derived) from a plurality of successive operating points, the predictor may implement a recurrent neural network, so that each time a further operating point is supplied to the predictor by the value-supply system, this further operating point is added to the plurality of operating points used just before in a FIFO-queue manner, so as to obtain an updated plurality of operating points to be used for issuing a further updated value for each regulator parameter.

One or more of the following additional features can be implemented advantageously, separately or in combination of several of them:

In one embodiment, the power converter is a DC-DC power converter or an AC-DC power converter;

In one embodiment, the regulator is a (PID) proportional, integral and/or derivative-based regulator, and the at least one regulator parameter includes one or more of $k_p$-, $k_i$- and $k_d$-coefficients implemented in this regulator;

In one embodiment, the predictor includes a lookup table for storing labelled training data, and the predictor selects one of these labelled training data as a nearest neighbor to the at least one operating point;

In one embodiment, the predictor implements at least one calculation step of regression-type, in a calculation sequence used for issuing the updated value for each regulator parameter from the at least one operating point;

In one embodiment, the predictor is arranged for operating in a feed-forward artificial intelligence manner;

In one embodiment, the predictor is arranged for operating as a neural network, in particular for operating as a single-layer neural network; and the predictor is implemented as or in a neuromorphic chip.

Further embodiments herein include a method for performing an electrical power conversion, from an input current and an input voltage to an output current and an output voltage, the method comprising:

using a regulator, generating at least one control signal effective for the power conversion, the regulator implementing at least one regulator parameter;

collecting at least one operating point occurring during the DC-DC power conversion, each operating point relating to an instant of operation during the power conversion and comprising on the one hand measured values for the instant of operation, for one or more input parameters among the input current, the input voltage, a phase input current, a phase input voltage, and/or for one or more output parameters among the output current, the output voltage, a phase output current, a phase output voltage, and on the other hand at least one value of a target output voltage for the power conversion assigned to the instant of the operating point; and using a predictor, providing a respective updated value for each regulator parameter, each updated regulator parameter value being destined for further implementation by the regulator.

According to embodiments herein, each updated regulator parameter value is determined by the predictor using a process based on the at least one collected operating point, and also based on predictor parameters that have been obtained from a machine-learning process.

In accordance with further embodiments, the method includes one or more of the following preliminary operations /1/ to /3/ executed during the machine-learning process:

/1/ gathering labeled training data that comprise training operating points and respective associated values for each regulator parameter;

/2/ using the labeled training data for training a machine-learning model of the predictor, so as to obtain the predictor parameters to be used by the predictor for inferring each new value of each regulator parameter; and /3/ transmitting the predictor parameters to the predictor.

Then, the power conversion is operated using the predictor parameters transmitted in step /3/.

In accordance with further embodiments, operation /2/ is performed using computational hardware disposed external to the power converter providing the power conversion. In one embodiment, the computational hardware is disconnected from the power converter so that the power converter performs the power conversion without being connected any longer to the computational hardware.

A power conversion performed according to embodiments herein can be implemented for supplying electrical power to any load such as a load forming part of a data center or server farm. It may be implemented for supplying electrical power to a microprocessor, a graphic processor or a memory set.

In accordance with further embodiments, such microprocessor or a graphic processor may form itself the part of the data center or server farm which is power-supplied in accordance with embodiments herein. Alternatively, the power conversion performed according to embodiments herein is a first power conversion stage used for supplying electrical power to a downstream power converter.

Generally, a power conversion performed according to embodiments herein is produced using a power converter which is in accordance with the first invention aspect, including the improvements and preferred embodiments listed.

Note that any of the resources (such as predictor, PID regulator, etc.) as discussed herein can include one or more computerized devices, circuits, power converter circuits, etc., to carry out and/or support any or all of the method operations disclosed herein. In other words, one or more computerized devices or processors can be programmed and/or configured to operate as explained herein to carry out the different embodiments as described herein.

Yet other embodiments herein include software programs to perform the steps and operations summarized above and disclosed in detail below. One such embodiment comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, embodiments herein are directed to a method, system, computer program product, etc., that supports operations as discussed herein.

One embodiment includes a computer readable storage medium and/or system having instructions stored thereon to provide power conversion. The instructions, when executed by computer processor hardware, cause the computer processor hardware (such as one or more co-located or disparately located processor devices) to: i) receive current samples of operational settings of the power converter; ii) derive a set of power supply coefficients from the current samples of operational settings of the power converter, the power supply coefficients being a machine-learned control response assigned to a set of prior samples of operational settings of the power converter to maintain the output voltage within regulation, and iii) output the set of power supply coefficients to the regulator.

The ordering of the steps above has been added for clarity sake. Note that any of the processing steps as discussed herein can be performed in any suitable order. Other embodiments of the present disclosure include software programs and/or respective hardware to perform any of the method embodiment steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

As discussed herein, techniques herein are well suited to provide more efficient use of wireless services to communication devices. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein (BRIEF DESCRIPTION OF EMBODIMENTS) purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section (which is a summary of embodiments) and corresponding figures of the present disclosure as further discussed below.

These and other features of the invention will be now described with reference to the appended figures, which relate to preferred but not-limiting embodiments of the invention.

DETAILED DESCRIPTION

Figure 1:
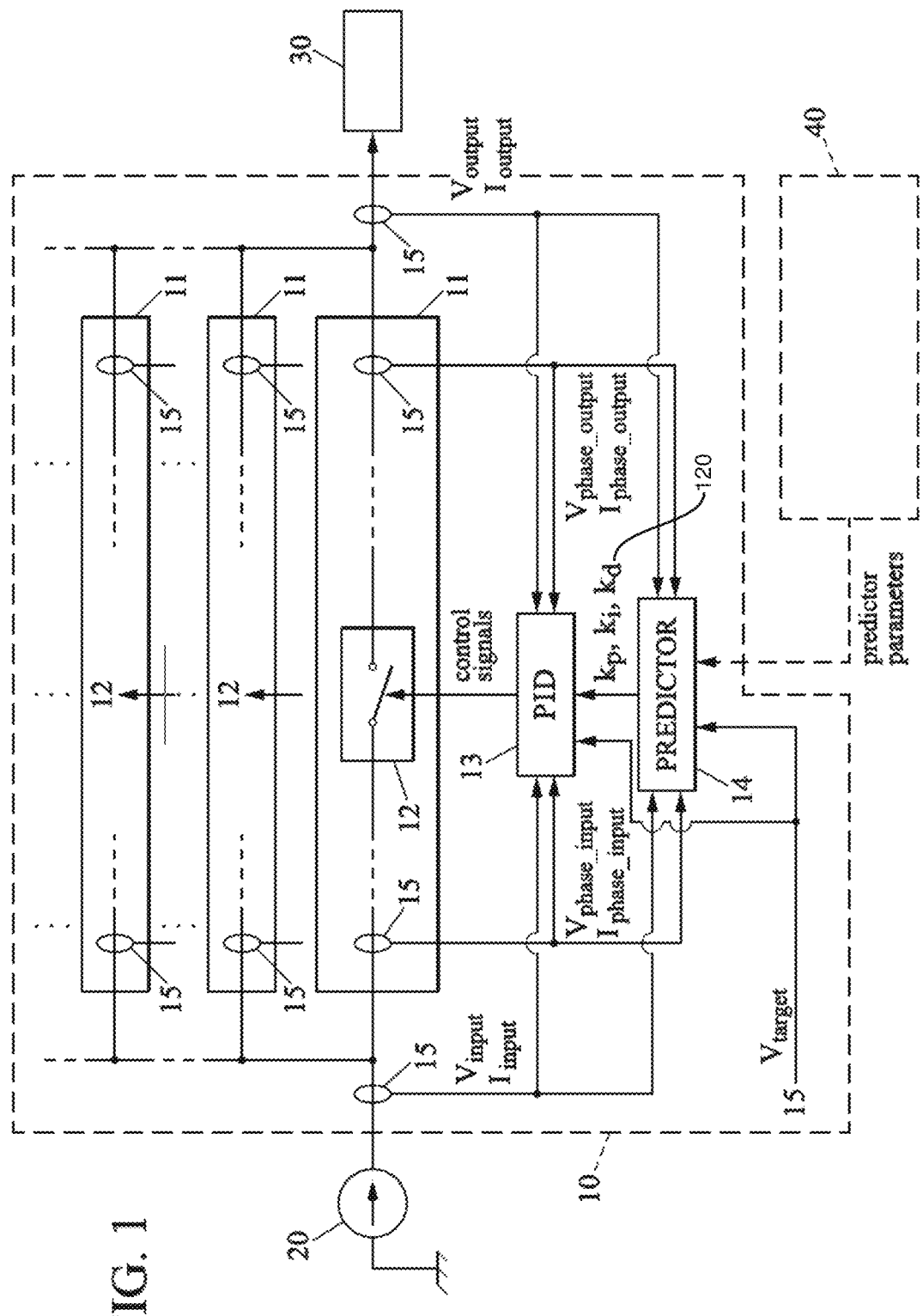
FIG. 1 is a diagram showing elements of an electrical power converter according to the invention.

For clarity sake, components and elements which are not directly concerned with embodiments herein are not described thereafter, given that one skilled in the art knows how to implement such components and elements.

For illustrative purpose but without limitation to such embodiment type, embodiments herein are now described for a DC-DC power converter, and for a regulator of PID-type. But it should be understood that embodiments herein can be implemented with any type of power converter, and with any regulator type for each power converter type. Other regulator types which may be used alternatively include proportional regulators, integral regulators, derivative regulators, proportional-integral regulators, integral-derivative regulators, proportional-derivative regulators, regulators which implement at least one higher order component for controlling the power conversion, delta-regulators, delta-sigma regulators, differential regulators, etc. It is only necessary for the invention that the regulator implements at least one regulator parameter for issuing at least one signal control that is used by the power converter for producing the conversion of input voltage and input current into output voltage and output current.

A DC-DC power converter in accordance with embodiments herein supplies electrical power to one or more loads such as a computer mother-board, but preferably specifically to a processor in a point-of-load configuration. For such configuration, one power converter is dedicated to one processor, and located next to it on a common printed circuit board.

In a known manner, the converter as described herein comprises one or more phases connected in parallel between an input of the converter and an output operative to power a load, i.e. the processor to be power-supplied in the present example. In one embodiment, each phase may comprise two switching devices, which produce each a connecting state during on-periods and an isolating state during off-periods. Each switching device is operated through control signals, for example PWM (pulse-width modulation) signals or PFM (pulse-frequency modulation) signals, which are issued by a PID regulator. Preferably, one PID regulator is common to all the switching devices of one converter.

In a known manner, conventional PID regulators (controllers) implement $k_p$-, $k_i$- and $k_d$-coefficients for generating the control signals based on operation parameters of the converter. The $k_p$-coefficient is the so-called proportional gain, the $k_i$-coefficient is the so-called integral gain and the $k_d$-coefficient is the so-called derivative gain. For such particular case of a PID regulator, the $k_p$-, $k_i$- and $k_d$-coefficients are the regulator parameters as mentioned in the general part of the description.

During operation, the converter according to embodiments herein receives an input current and an input voltage, denoted $I_{input}$ and $V_{input}$ respectively, from an external DC power source. measured values of this input current $I_{input}$ and input voltage $V_{input}$ may be collected repeatedly, for example every n-cycle operation period of the converter, n being a non-zero fixed integer such as 16, 32, 64, etc.

The converter transforms this input current $I_{input}$ and input voltage $V_{input}$ into an output current $I_{output}$ and an output voltage $V_{output}$ which are transmitted to the load. Measured values of this output current $I_{output}$ and output voltage $V_{output}$ may also be collected for the same operation instants.

In case of a multiphase converter, other values may be measured instead of the converter input/output voltage/current just mentioned, depending on the converter design. These other values may relate each to a current supplied to or issued by one of the phases, called phase input/output current and denoted $I_{phase\_input}$ or $I_{phase\_output}$, respectively. Similarly, a voltage supplied to or produced by one of the phases, called phase input/output voltage and denoted $V_{phase\_input}$ or $V_{phase\_output}$, respectively, may be used too. Such phase input/output current/voltage values may also be used in combination with some or all of the converter input values $I_{input}$ and $V_{input}$ and converter output values $I_{output}$ and $V_{output}$.

Collection of one or more of these measured values is performed by a so-called value-supply system (such as one or more sensors monitoring operational parameters of the power converter). This value-supply system gathers the measured value(s) which relate to one same instant of operation of the converter into one value set which is called operating point. Each operating point is further completed by the value-supply system with a target output voltage which also relates to the same operation instant as the measured values of this operating point. The target output voltage, denoted $V_{target}$, is used by the PID regulator for generating the control signals, so that the output voltage $V_{output}$ which is actually produced by the converter is close to the target output voltage $V_{target}$. Successive values of the target output voltage $V_{target}$ allow controlling variations in the instant output voltage which is supplied to the load, in particular depending on active periods or idle periods of modules internal to this load. They also allow controlling the converter output during transient periods which are intermediate between active and idle periods.

The value-supply system transmits each operating point to a predictor, which determines therefrom the values for the $k_p$-, $k_i$- and $k_d$-coefficients to be implemented in each PID regulator. The predictor transmits the determined $k_p$-, $k_i$- and $k_d$-values to the PID regulators of the converter, so that each of these PID regulators implements the $k_p$-, $k_i$- and $k_d$-coefficient values related to it from an instant subsequent to their reception.

More specifically, as shown in FIG. 1, reference number 10 denotes a DC-DC power converter; reference number 20 denotes the power supply which is connected to the input of the power converter 10; and reference number 30 denotes the load which is powered by the output of the power converter 10.

In one nonlimiting example embodiment, the power supply 20 is of DC-type and the load may a microprocessor, a memory, a laptop, a smartphone, a tablet, a LED light bulb, a TV, etc. Each reference number 11 denotes a separate phase of the converter, whatever their number, and each reference number 12 denotes one switching device within each phase 11. The internal structure of each phase 11 is not represented in FIG. 1, and may be of any type known in the art. For example, it may be of buck converter type. For clarity of the figure, only one switching device 12 per phase has been represented. The other reference numbers are:

13: the regulator, of PID-type controller in the example considered

14: the predictor

15: the value-supply system (one or more voltage or current sensors) although it is distributed at several locations in the figure The PID regulator 13 (PID controller), the predictor 14 and the value-supply system 15 are part of the DC-DC power converter 10 together with the phases 11.

The value-supply system 15 may comprise one or more voltage sensors and/or one or more current sensors, such as usual voltage and/or current sensors, for example direct current resistors for sensing the currents. These sensors may be combined with sample-and-hold units and analog-to-digital converters to issue at least some of the measured values $V_{input}$, $I_{input}$, $V_{output}$, $I_{output}$, $V_{phase\_input}$, $I_{phase\_input}$, $V_{phase\_output}$, $I_{phase\_output}$, corresponding to common instants of operation for the converter. Advantageously, the sampling period may be a multiple of the switching period of the phases 11, but the sampling period may also be selected depending on the converter application, for instance so as to update the PID parameters sufficiently fast with respect to the load changes. The sampling period may also be selected depending on the power consumption caused by each value measurement and each update of the $k_p$-, $k_i$- and $k_d$-values.

The measured values for at least some of $V_{input}$, $I_{input}$, $V_{output}$, $I_{output}$, $V_{phase\_input}$, $I_{phase\_input}$, $V_{phase\_output}$, $I_{phase\_output}$, and the target output voltage $V_{target}$ are transmitted by the value-supply system 15 (respective sensors) to the PID regulator 13 for operation of this latter in a manner as known before the present invention.

According to one embodiment, the operating point(s), i.e. the measured value(s) for one or more of $V_{input}$, $I_{input}$, $V_{output}$, $I_{output}$, and optionally $V_{phase\_output}$ and $I_{phase\_output}$, and the target output voltage $V_{target}$, is transmitted to the predictor 14 for determining the $k_p$-, $k_i$- and $k_d$-coefficient values to be implemented in the PID regulator 13.

Operation of the predictor 14 is now described.

Preferably, the predictor 14 includes a FIFO-queue (i.e., data buffer) like memory set for storing a fixed number of operating points which relate to successive operation instants of the converter. For example, a further operating point is issued by the value-supply system 15 at the end of every sampling time. This further operating point is stored into an entrance cell of the FIFO-queue like memory set, and all the previously stored operating points are shifted by one cell in the queue toward the last memory cell. That one of the operating points which was stored at the last memory cell of the queue is dropped. All or a portion of data in the memory set is used for determining the next values for the $k_p$-, $k_i$- and $k_d$-coefficients. This allows anticipating events such as load changes, voltage changes, phase dropping and any possible event to occur by implementing in advance $k_p$-, $k_i$- and $k_d$-values that are appropriate for such event.

For predicting the values of the $k_p$-, $k_i$- and $k_d$-coefficients in a way appropriate to each application, the predictor 14 implements an algorithm called machine-learning model. Such machine-learning model may be run within the predictor 14 as embedded software or directly in hardware, or any combination of both. This allows using a same silicon chip for any application of the converter 10. In particular, using a neuromorphic chip which implements a spiking neural network for the predictor 14 enables a very energy-efficient hardware implementation of the machine-learning model.

A simple machine-learning model for the predictor 14 includes storing within the predictor a number of operating points of the power converter 10 with associated values for the $k_p$-, $k_i$- and $k_d$-coefficients. Preferably, series of successive operating points are stored with associated values for the $k_p$-, $k_i$- and $k_d$-coefficients.

Then, each time the value-supply system 15 provides a series of actual operating points, an algorithm, such as a nearest-neighbor algorithm, determines which one of the previously stored operating point series (from machine learning) is the nearest to the series of actual operating points. The difference between the actual operating point series and any one of the stored operating point series may be calculated using any norm commonly known in the art.

The values for the $k_p$-, $k_i$- and $k_d$-coefficients to be implemented are then those associated with the nearest one of the stored operating point series. For such implementation, the stored operating point series with associated values for the $k_p$-, $k_i$- and $k_d$-coefficients may be recorded in a lookup table which is internal to the predictor 14. They constitute so-called labelled training data, and also the predictor parameters that are used by the predictor 14 for inferring each new set of updated $k_p$-, $k_i$- and $k_d$-values. Such implementation of embodiments herein is more appropriate when the converter 10 has to accommodate to a small number of operation schemes.

Figure 2:
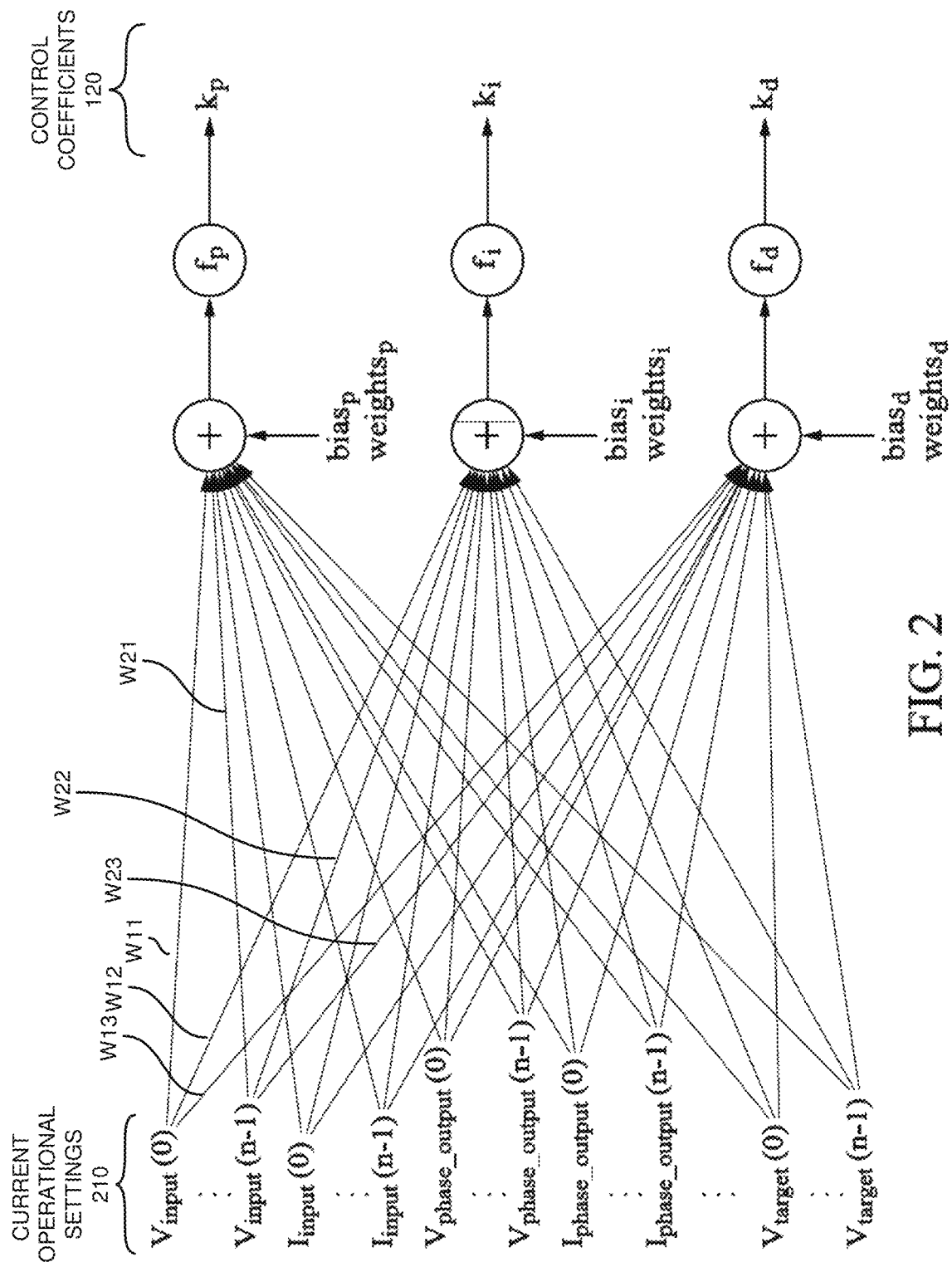
FIG. 2 is an example diagram illustrating a calculation sequence implemented by a predictor according to embodiments herein.

Another possible machine-learning model may be based on regression and may use a neural network. Such regression-based implementation allows continuous changes for the $k_p$-, $k_i$- and $k_d$-values and thus avoids value jumps as those which may result from the above-described nearest-neighbor implementation. A minimum calculation structure to be implemented within the predictor 14 for such regression-based implementation is shown in FIG. 2. It is commonly called perceptron of linear classifier type. For obtaining the next value to be transmitted to the PID regulator 13 for each of the the $k_p$-, $k_i$- and $k_d$-coefficients, all the measured values for at least some of $V_{input}$, $I_{input}$, $V_{output}$, $I_{output}$ and $V_{phase\_input}$, $I_{phase\_input}$, $V_{phase\_output}$, $I_{phase\_output}$ for some or all of the phases, and the target output voltage $V_{target}$, for all the operating points stored in the FIFO-queue memory set are multiplied with predetermined weights and added together and to predetermined bias. The result of such combination is then inputted as an argument into an activation function dedicated to the $k_p$-, $k_i$- or $k_d$-coefficient. The result of the activation function is the next value for this coefficient to be implemented by the PID regulator 13.

Each calculation structure of such type is a feed-forward neuron, and one separate neuron is dedicated to each of the $k_p$-, $k_i$- and $k_d$-coefficients. In FIG. 2, weights$_p$ and bias$_p$ are the predetermined weights and bias, respectively, that are used for that of the combinations of the measured values and target output voltage which relates to $k_p$-coefficient. $f_p$ is the activation function for $k_p$-coefficient. Similar meaning applies separately for weights$_i$, bias$_i$, $f_i$ and weights$_d$, bias$_d$, $f_d$ with respect to the $k_i$- and $k_d$-coefficients. Hidden layers may be added in a known manner within each neuron for determining the $k_p$-, $k_i$- and $k_d$-values in a sharper manner with respect to the operating points. The number of hidden neural layers, the number of operating points which are combined for each $k_p$-, $k_i$- and $k_d$-determination, and also the determination frequency, are to be selected with respect to a balance between computational effort, prediction precision, and special features of each converter application, in particular relating to the load.

In FIG. 2, n is the number of operating points (samples) which are involved for each determination of the $k_p$-, $k_i$- and $k_d$-values, i.e. the number of operating points (samples) in each series for a respective power supply parameter. For the predictor 14 as described before, n is the length of the FIFO-queue memory set. But the memory amount which is thus necessary when n increases and for a multiphase converter may become important. Then, a way to reduce such memory amount is to store at least part of the history information, e.g. the operating points before the last one transmitted by the value-supply system 15 to the predictor 14, directly in the neuron network instead of the entrance FIFO-queue like memory set. Such neural network configuration is known in the art as recurrent neural network. Among such recurrent neural networks, long short-term memories may be preferred because they avoid vanishing or exploding gradients.

The weights and bias for all $k_p$-, $k_i$- and $k_d$-coefficients are the predictor parameters as mentioned in the general part of this description. They are to be provided to the predictor 14 through a preliminary phase called training. Such training is preferably to be achieved by computational hardware/software 40 (see in FIG. 1) which are external to the predictor 14, because of the quite large computer resources that may be necessary for determining the predictor parameters from labelled training data. The computational hardware/software 40 may be provided as a separate computer or be accessed through the cloud. Such configuration for the computational hardware/software 40 that are used for the training phase is advantageous since the computational hardware/software may be shared between a large number of users, thereby allowing computational means that may be expensive to be implemented in a cost-effective manner. Each user can access the computational hardware/software for the initial training phase of the predictor of his power converter, and then his power converter can run for a long duration without requiring the computational means again.

The training phase mainly comprises the following three steps:
- forming sets of labeled training data, such as each set comprises a series of successive operating points of the converter with associated values for the $k_p$-, $k_i$- and $k_d$-coefficients. In this way, each set of labeled training data describes an operation sequence over time which is possible for the converter, including instant values for the input and output voltages and currents, optionally the phase output voltages and currents, and also for the target output voltage. Desired values for the $k_p$-, $k_i$- and $k_d$-coefficients are associated with each series of successive operating points. In the art, the desired $k_p$-, $k_i$- and $k_d$-values are called labels. The labeled training data may advantageously be selected in a manner appropriate with respect to the application contemplated for the power converter 10, and in particular with respect to its load 30, for obtaining optimized operation of the converter later in its specific application;
- then the predictor parameters are determined by the computational means 40 using one of known machine-learning processes such as gradient descent, in particular a Newton's method, or a conjugate gradient algorithm, a statistic optimization method, in particular a genetic algorithm, or any process implementing back-propagation, etc; and
- the predictor parameters are transferred to the predictor 14 for this latter to determine later on the $k_p$-, $k_i$- and $k_d$-values using the predictor parameters. The transfer of the predictor parameters to the predictor 14 may be performed through value transfer or by writing corresponding firmware to be implemented within the predictor 14.

Then, running of the predictor 14 while the converter 10 is supplying the load 30 with DC power results in producing the $k_p$-, $k_i$- and $k_d$-values. The updated $k_p$-, $k_i$- and $k_d$-values are transferred to the PID regulator 13, so that this latter switches from a previously implemented $k_p$-, $k_i$- and $k_d$-value set to the updated one.

Figure 3:
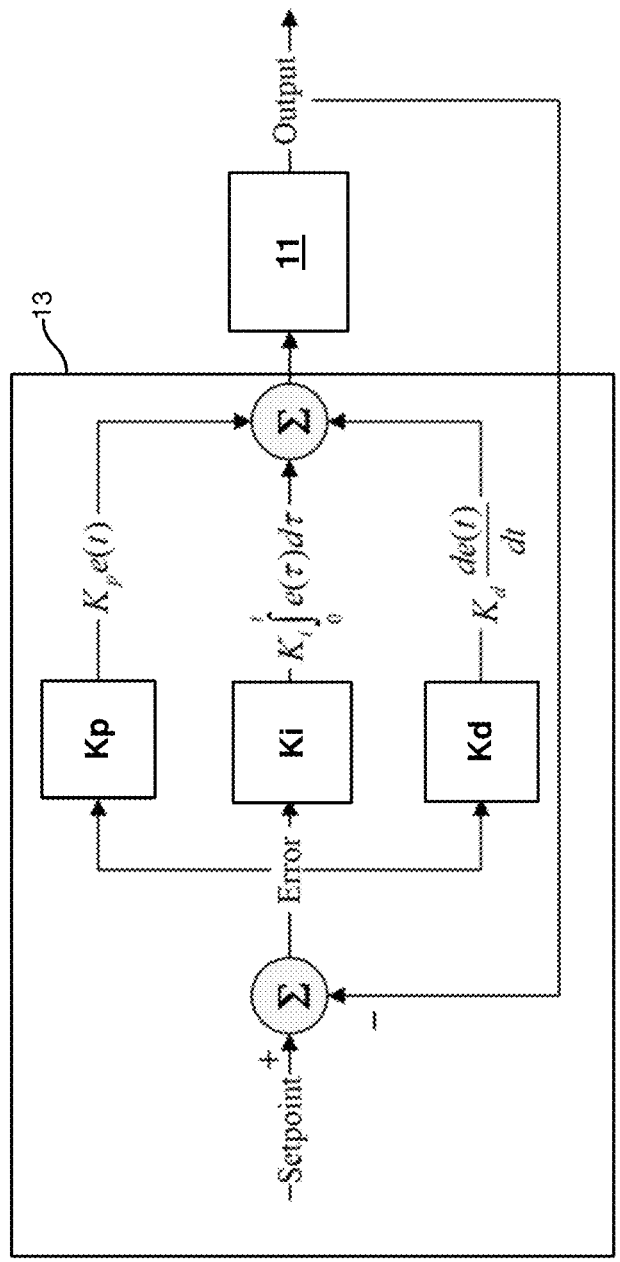
FIG. 3 is an example diagram illustrating a PID controller and application of power supply coefficients according to embodiments herein.

FIG. 3 is an example diagram illustrating a PID controller according to embodiments herein.

In this example embodiment, the PID controller 13 receives settings of the power supply coefficients (Kp, Ki, and Kd) from the predictor 14. The PID controller uses the received coefficients to set (control) respective gains of each respective P, I, D path as shown.

Figure 4:
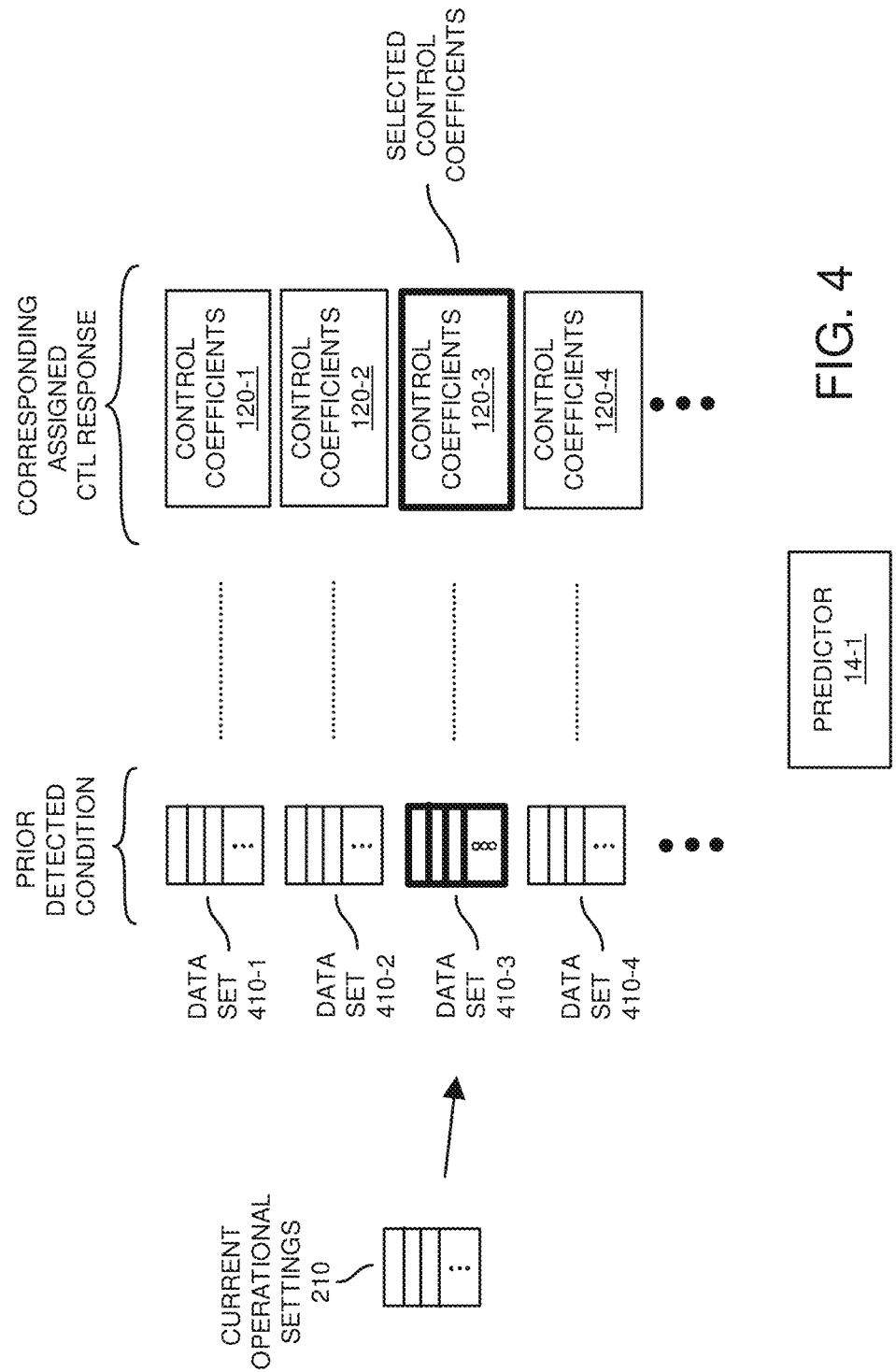
FIG. 4 is an example diagram illustrating mapping of current operating settings of a power converter to appropriate control coefficients to achieve a desired control response according to embodiments herein.

FIG. 4 is an example diagram illustrating mapping of current operating settings of a power converter to appropriate control coefficients to achieve a desired control response according to embodiments herein.

As previously discussed, the power converter 10 includes multiple phases 11; the regulator 13 controls the multiple phases 11, converting the input voltage to the output voltage.

In the example embodiment of FIG. 4, the instantiation of predictor 14-1 (such as hardware and/or software) is operative to receive current collected samples of operational settings 210 of the power converter 10. Operational settings 210 are indicated as data set 410-1, data set 410-2, data set 410-3, etc.

Data set 410-1 (such as data stored in multiple FIFO buffers) is a first set of buffered samples obtained at different sample times for each of multiple parameters such as $V_{input}$, $I_{input}$, etc.

Data set 410-2 (such as data stored in multiple FIFO buffers) is a second set of buffered samples obtained at different sample times for each of multiple parameters such as $V_{input}$, $I_{input}$, etc.

Data set 410-3 (such as data stored in multiple FIFO buffers) is a third set of buffered samples obtained at different sample times for each of multiple parameters such as $V_{input}$, $I_{input}$, etc.; and so on.

Thus, each of the prior collected sets of data samples (such as data set 410-1, data set 410-2, etc.) include a respective sequence of multiple data samples for each of multiple parameters (such as $V_{input}$, $I_{input}$, $V_{output}$, $I_{output}$, etc.) of the power converter collected over time.

As further shown, the predictor 14 is operative to convert the current collected samples of operational settings 210 of the power converter 10 to appropriate control coefficients 120. In one embodiment, the generated control coefficients 120 is a machine-learned control response assigned to a pattern of previously stored samples of operational settings of the power converter 10 as indicated by the data sets 410.

In one embodiment, the current collected samples of operational settings 210 of the power converter 10 represent current operational conditions of the power converter 10. The previously stored samples of operational settings (such as data set 410-1 indicating a first prior operational condition of power converter 10, data set 410-2 indicating a second prior operational condition of power converter 10, data set 410-3 indicating a third prior operational condition of power converter 10, and so on).

In this example embodiment, based on prior machine learning, each of the different sets of prior detected conditions (operational settings 210) maps to a corresponding appropriate control response.

More specifically, for conditions (such as monitored voltage/current settings) of the power converter 10 as indicated by data set 410-1, the control coefficients 120-1 (such as indicating settings for each of one or more coefficients Kp, Ki, and Kd) indicates a corresponding appropriate control response to control the power converter 10.

For conditions (such as settings) of the power converter 10 as indicated by data set 410-2, the control coefficients 120-2 (such as indicating settings for each of one or more coefficients Kp, Ki, and Kd) indicates a corresponding appropriate control response to control the power converter 10.

For conditions (such as settings) of the power converter 10 as indicated by data set 410-3, the control coefficients 120-3 (such as indicating settings for each of one or more coefficients Kp, Ki, and Kd) indicates a corresponding appropriate control response to control the power converter 10.

For conditions (such as settings) of the power converter 10 as indicated by data set 410-4, the control information 120-4 (such as indicating settings for each of one or more coefficients Kp, Ki, and Kd) indicates a corresponding appropriate control response to control the power converter 10.

In this example embodiment, assume that the current operational settings 210 (for N samples) of the power converter 10 most closely resemble/match the settings as indicated by the data set 410-3. In other words, the current (recently) collected samples of operational settings 210 of the power converter 10 most closely match the pattern of previously stored samples of operational settings of the power converter 10. In such an instance, the predictor 14-1 maps data set 410-3 to the appropriate control response as indicated by the control coefficients 120-3 for selection and application to the PID controller 13.

As previously discussed, in one embodiment, the generated control information 120 (derived from control coefficients 120-3) indicates power supply coefficient settings for the previous operational conditions (associated with data set 410-3). Setting of the one or more PID coefficients in the power converter 10 as specified by the control coefficients 120 maintains the output voltage of the power converter 10 within a desired voltage range.

Subsequent to generating the control 120 (such as selected from control coefficients 120-3), the predictor 14-1 outputs the selected control coefficients 120 to the PID controller 13 or other suitable resource to control the multiple phases.

Accordingly, in one embodiment, the predictor 14-1 is further operative to map the current collected samples of operational settings 210 of the power converter 10 to the previously stored samples of operational settings (such as data set 410-3) of the power converter 10 to identify and select appropriate control coefficients 120-3 for current operational settings 210 of the power supply. As previously discussed, the previously stored samples of operational settings (as indicated by the data set 410-3 are one of multiple sets of previously stored samples of operational settings (data sets 410) of the power converter.

Figure 5:
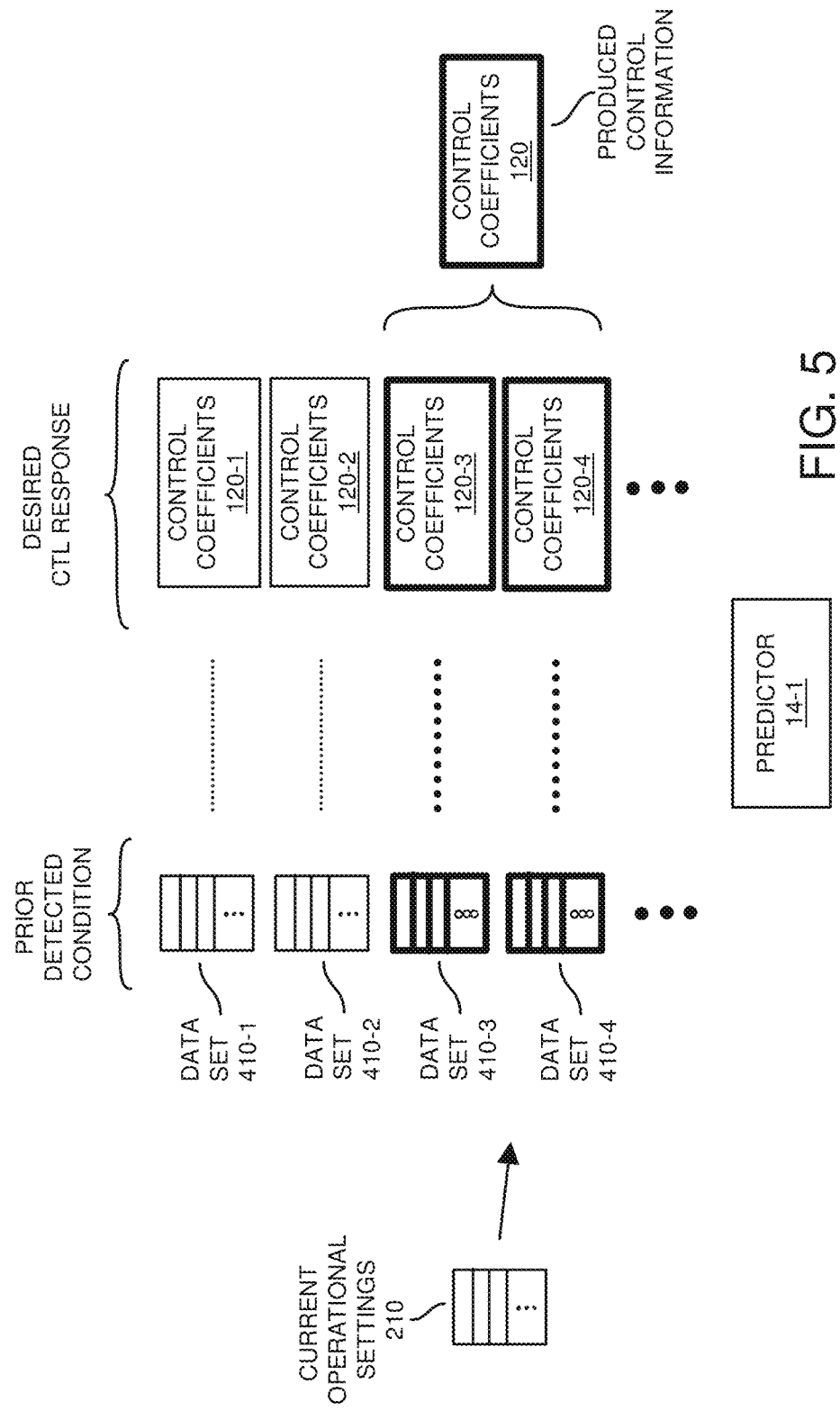
FIG. 5 is an example diagram illustrating mapping of current operating settings of a power converter to multiple sets of control coefficients and derivation of control coefficients from the multiple sets to achieve a desired control response according to embodiments herein.

FIG. 5 is an example diagram illustrating mapping of current operating settings of a power converter 10 to multiple sets of control coefficients and derivation of control coefficients from the multiple sets to achieve a desired control response according to embodiments herein.

In this example embodiment, the predictor 14-1 identifies that the current operational settings 210 most closely match both the settings as specified by the data set 410-3 and settings as specified by the data set 410-4. In such an instance, the predictor 14-1 applies interpolation and/or extrapolation techniques to derive control coefficients 120 from the combination of control coefficients 120-3 and control coefficients 120-4.

Figure 6:
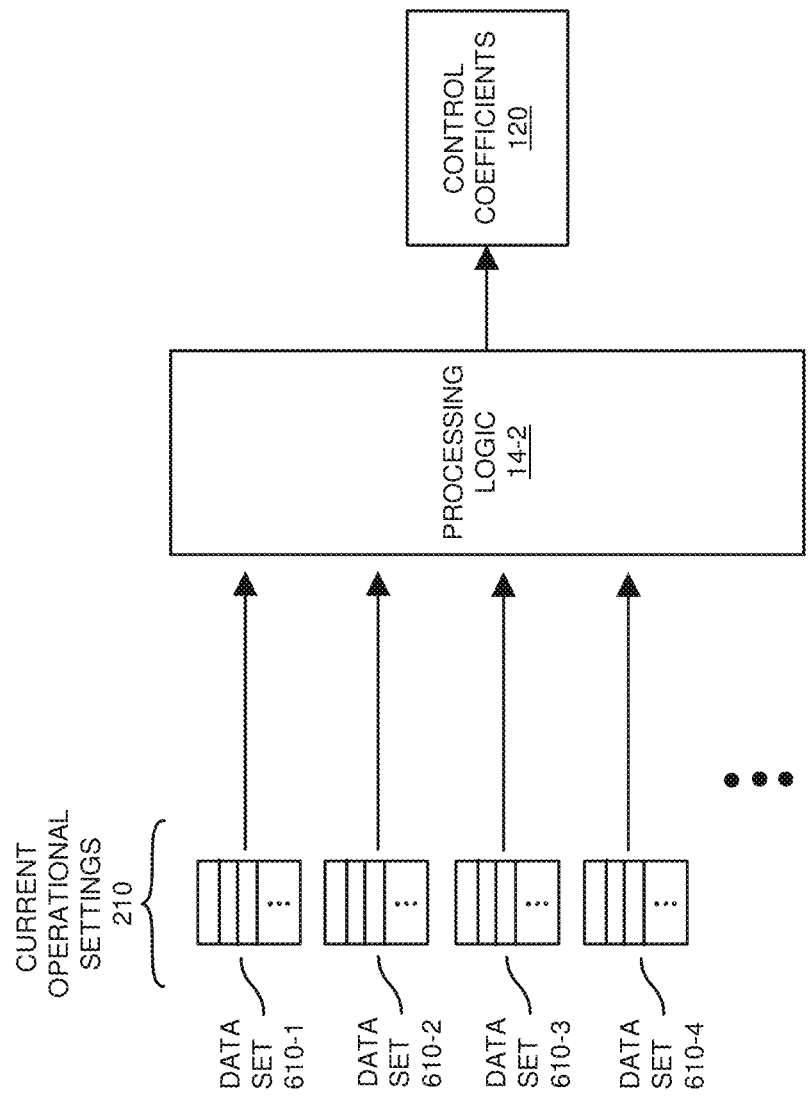
FIG. 6 is an example diagram illustrating use of logic to derive control coefficients to control a power converter according to embodiments herein.

FIG. 6 is an example diagram illustrating use of logic to derive control information to control a power converter according to embodiments herein.

In this example embodiment, similar to FIG. 3, the processing logic of predictor 14-2 receives current operational settings 210 of the power converter 10 such as stored in buffers 610 and derives control coefficients 120 based on such information.

Buffer 610-1 stores samples of $V_{input}$; buffer 610-2 stores samples of $I_{input}$; buffer 610-3 stores samples of $V_{phase}$ output; buffer 610-4 stores samples of $I_{phase\_output}$; and so on.

Control coefficients 120 indicates settings to apply to the regulator 13 in a manner as previously discussed.

Figure 7:
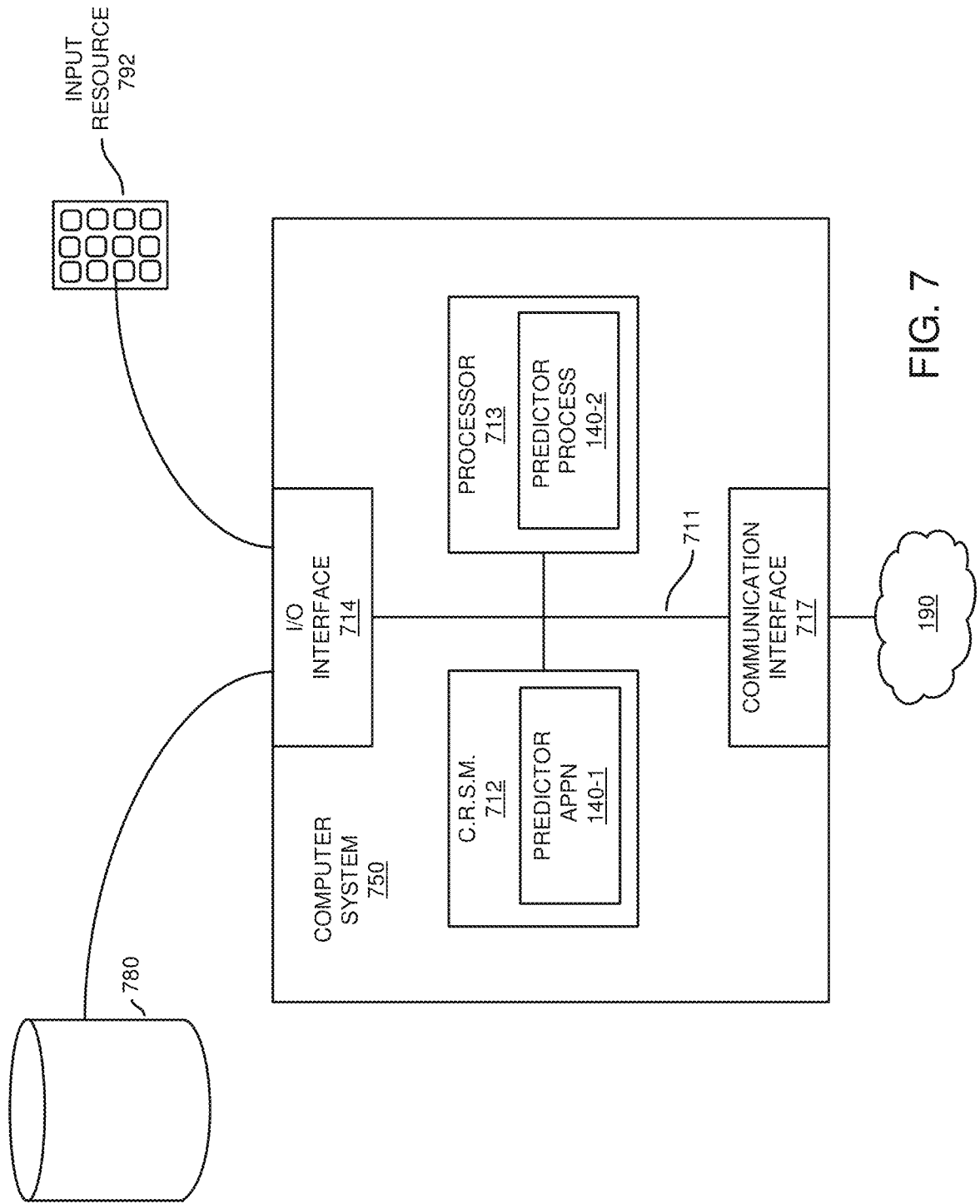
FIG. 7 is a diagram illustrating example computer architecture to execute one or more operations according to embodiments herein.

FIG. 7 is an example block diagram of a computer system for implementing any of the operations as previously discussed according to embodiments herein.

Any of the resources (such as predictor 14, regulator 13, etc.) as discussed herein can be configured to include computer processor hardware and/or corresponding executable instructions to carry out the different operations as discussed herein.

As shown, computer system 750 of the present example includes an interconnect 711 that couple computer readable storage media 712 such as a non-transitory type of media (which can be any suitable type of hardware storage medium in which digital information can be stored and retrieved), a processor 713 (computer processor hardware), I/O interface 714, and a communications interface 717.

I/O interface(s) 714 supports connectivity to repository 780 and input resource 792.

Computer readable storage medium 712 can be any hardware storage device such as memory, optical storage, hard drive, floppy disk, etc. In one embodiment, the computer readable storage medium 712 stores instructions and/or data.

As shown, computer readable storage media 712 can be encoded with communication predictor application 140-1 (e.g., including instructions) to carry out any of the operations as discussed herein.

During operation of one embodiment, processor 713 accesses computer readable storage media 712 via the use of interconnect 711 in order to launch, run, execute, interpret or otherwise perform the instructions in predictor application 140-1 stored on computer readable storage medium 712. Execution of the predictor application 140-1 produces predictor process 140 2 to carry out any of the operations and/or processes as discussed herein.

Those skilled in the art will understand that the computer system 750 can include other processes and/or software and hardware components, such as an operating system that controls allocation and use of hardware resources to execute communication management application 140-1.

In accordance with different embodiments, note that computer system may reside in any of various types of devices, including, but not limited to, a mobile computer, a personal computer system, a wireless device, a wireless access point, a base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, set-top box, content management device, handheld remote control device, any type of computing or electronic device, etc. The computer system 750 may reside at any location or can be included in any suitable resource in any network environment to implement functionality as discussed herein.

Functionality supported by the different resources will now be discussed via the flowchart in FIG. 8. Note that the steps in the flowcharts below can be executed in any suitable order.

Figure 8:
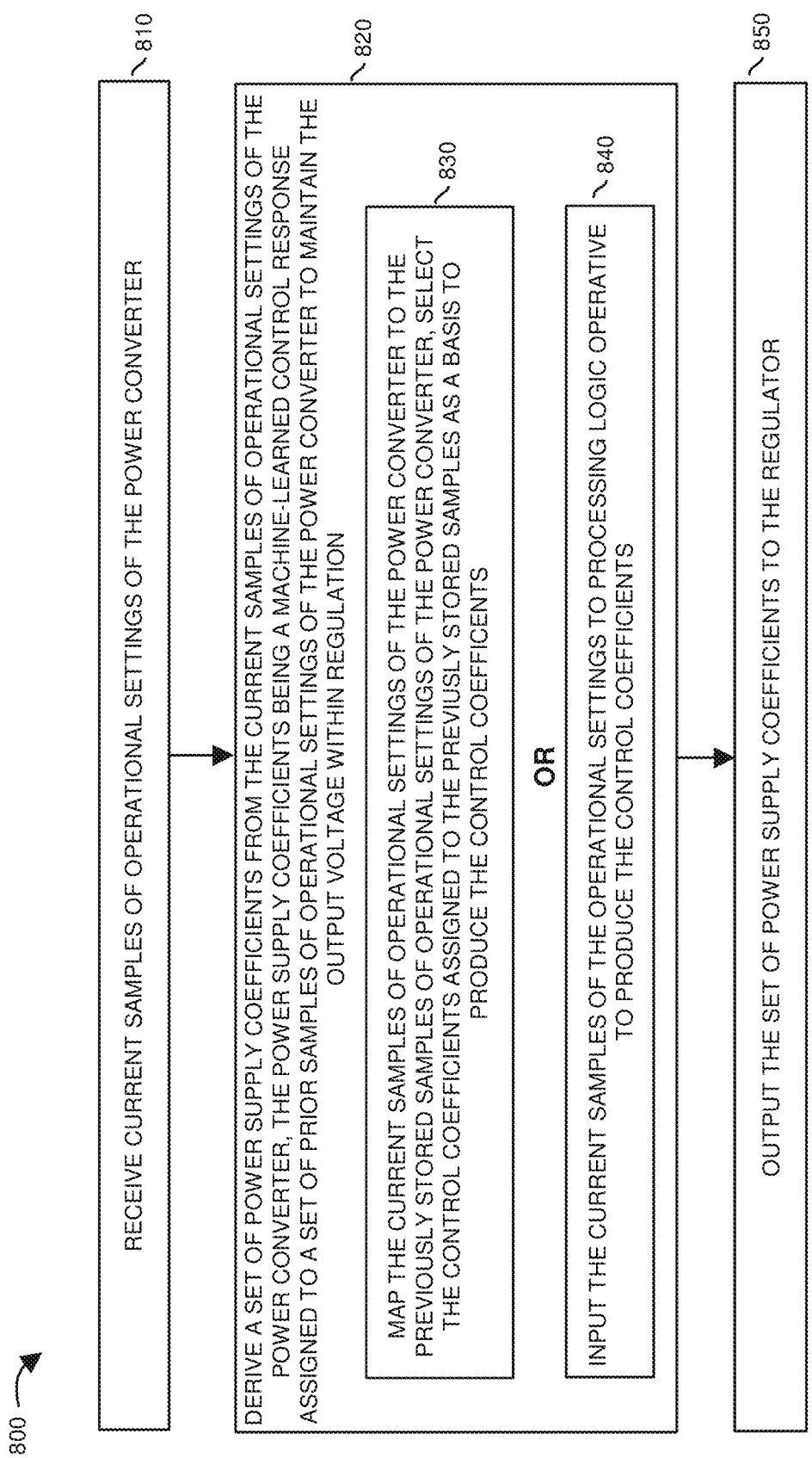
FIG. 8 is an example diagram illustrating methods according to embodiments herein.

FIG. 8 is a flowchart 800 illustrating an example method according to embodiments. Note that there will be some overlap with respect to concepts as discussed above.

In processing operation 810, the predictor 14 receives current samples of operational settings 210 of the power converter 10.

In processing operation 820, the predictor 14 derives a set of power supply coefficients 120 (such as Kp, Ki, and/or Kd) from the current samples of operational settings 210 of the power converter 10, the set of power supply coefficients 120 being a machine-learned control response assigned to a corresponding set of prior samples of operational settings of the power converter 10 to maintain the output voltage within regulation.

In processing operation 830 (such as a sub-operation of processing operation 820), the predictor 14 maps the current samples of operational settings 210 of the power converter 10 to the prior samples of operational settings of the power converter 10 to identify appropriate control coefficients 120 to maintain the output voltage within regulation.

In processing operation 840 (such as an alternative to sub-operation 830), the predictor 14 inputs the current samples of the operational settings 210 to processing of the predictor 14, which is operative to produce the control coefficients 120 from the received settings 210.

In processing operation 850, the predictor 14 outputs the control coefficients 120 to the PID controller 13 to control the multiple phases of the power converter 10.

Although the detailed description has been focused on predictor embodiments suitable for implementing nearest-neighbor or regression-based machine-learning models, one should understand that the invention is not limited to these specific models, and others can be used alternatively. In particular, any regression variant and any sequence based on hidden Markov chains may be used.

One should also understand that the invention applies to any electrical power conversion other than DC-DC, in particular AC-DC power conversion, although the detailed description has been focused on DC-DC power conversion for illustrative purpose.

Finally, one should further understand that the invention applies for any regulator type, without being limited to PID regulators. In each case, the predictor is adapted for providing updated values for the parameters as implemented in the regulator used for producing the power conversion.

The invention claimed is:

1. An apparatus comprising:
a voltage regulator operative to convert an input voltage into an output voltage;
a storage resource operative to store map information that provides a mapping between prior operational states of the voltage regulator and respective sets of control values that control the voltage regulator; and
a controller operative to:
i) receive current operational states of the voltage regulator;
ii) via the map information, map the current operational states to a corresponding set of control values; and
iii) apply the corresponding set of control values to the voltage regulator to convert the input voltage into the output voltage.

2. The apparatus as in claim 1, wherein the control values as specified by the map information are machine-learned control responses assigned to the respective sets of control values to maintain a magnitude of the output voltage within regulation over different operational states of the voltage regulator.

3. The apparatus as in claim 1, wherein the sets of control values are sets of control coefficients applied via the controller to process an error signal.

4. The apparatus as in claim 1, wherein the sets of control values are generated via bias and weight values associated with the voltage regulator.

5. The apparatus as in claim 1, wherein the prior operational states and current operational states of the voltage regulator include: magnitudes of the output voltage and magnitudes of an output current supplied by the output voltage to the load.

6. The apparatus as in claim 1, wherein the current operational states of the voltage converter substantially match prior samples of operational states of the voltage converter that map to the corresponding set of control values; and
wherein the controller is further operative to select the corresponding set of control values based on a substantial match of the current operational states to the prior samples of operational states of the voltage converter.

7. The apparatus as in claim 1, wherein the prior operational states of the voltage regulator include first prior operational states and second prior operational states;
wherein the respective sets of control values include a first set of control values and a second set of control values.

8. The apparatus as in claim 7, wherein the map information maps the first prior operational states of the voltage regulator to the first set of control values, the first set of control values providing a first control response to the voltage regulator; and
wherein the map information maps the second prior operational states of the voltage regulator to the second set of control values, the second set of control values providing a second control response to the voltage regulator.

9. The apparatus as in claim 1, wherein the current samples of operational states of the voltage regulator are obtained via sampling multiple operational parameters of the voltage regulator.

10. The apparatus as in claim 9, wherein the current samples of operational settings of the voltage regulator include a respective sequence of multiple data samples for each of the multiple operational parameters of the voltage regulator collected over time.

11. The apparatus as in claim 1, wherein the received set of current operational states includes a sequence of current samples of a monitored parameter of the voltage regulator; and
wherein the first set of prior operational states includes a sequence of prior samples of the monitored parameter of the voltage regulator.

12. The apparatus as in claim 11, wherein a pattern associated with the sequence of current samples of the monitored parameter match a pattern associated with the sequence of prior samples of the monitored parameter.

13. The apparatus as in claim 12, wherein the corresponding first set of control values assigned to the first set of prior operational states represents a control response to maintain a magnitude of the output voltage within a desired voltage range for the first set of prior operational states.

14. The apparatus as in claim 1, wherein the current operational states of the voltage regulator include a respective sequence of multiple data samples for each of multiple parameters of the voltage regulator collected over multiple sample times.

15. The apparatus as in claim 14, wherein the respective sequence of multiple data samples for each of the multiple parameters include:
a first current sequence of buffered samples measuring a magnitude of the input voltage over multiple current sample times;
a second current sequence of buffered samples measuring a magnitude of input current provided to multiple phases by the input voltage over the multiple current sample times;
a third current sequence of buffered samples measuring a magnitude of the output voltage over the multiple current sample times; and a fourth current sequence of buffered samples measuring a magnitude of output current provided by the output voltage to a load over the multiple current sample times.

16. The apparatus as in claim 15, wherein the prior operational states include:
a first prior sequence of buffered samples measuring a magnitude of the input voltage over multiple prior sample times;
a second prior sequence of buffered samples measuring a magnitude of input current provided to multiple phases by the input voltage over the multiple prior sample times;
a third prior sequence of buffered samples measuring a magnitude of the output voltage over the multiple prior sample times; and
a fourth prior sequence of buffered samples measuring a magnitude of output current provided by the output voltage to a load over the multiple prior sample times.

17. The apparatus as in claim 1, wherein the voltage regulator is configured to operate at a substantially higher operating frequency to regulate a magnitude of the output voltage than a frequency of the controller mapping the current operational states to the corresponding set of control values and applying the corresponding set of control values to the voltage regulator.

18. The apparatus as in claim 1, wherein the prior operational states of the voltage regulator include a first set of prior operational states of the voltage regulator, the first set of prior operational states being one of multiple sets of prior operational states, each of the multiple sets of prior operational states being assigned a different control response.

19. The apparatus as in claim 1, wherein the controller is further operative to match the current operational states of the voltage regulator to the prior operational states of the voltage regulator to identify the corresponding set of control values.

20. A method comprising:
storing map information in a repository, the map information providing a mapping between prior operational states of a voltage regulator and respective sets of control values that were previously implemented to control the voltage regulator;
receiving current operational states of the voltage regulator;
via the map information, mapping the current operational states to a corresponding set of control values; and
applying the corresponding set of control values to the voltage regulator to convert an input voltage into an output voltage.

21. The method as in claim 20, wherein the control values as specified by the map information are machine-learned control responses assigned to the respective sets of control values to maintain a magnitude of the output voltage within regulation over different operational states.

22. The method as in claim 20, wherein the sets of control values are sets of control coefficients; and
wherein applying the corresponding set of control values to the voltage regulator includes applying a set of control coefficients to an error signal of the voltage regulator.

23. The method as in claim 20, further comprising:
generating the sets of control values via bias and weight values associated with the voltage regulator.

24. The method as in claim 20, wherein the prior operational states and current operational states of the power converter include sampling of a magnitude of the output voltage and a magnitude of an output current supplied by the output voltage to a load.

25. The method as in claim 20, further comprising:
matching the current operational states of the voltage converter to prior samples of operational states of the voltage converter that map to the corresponding set of control values; and
selecting the corresponding set of control values based on a substantial match of the current operational states to the prior samples of operational states of the voltage converter.

26. The method as in claim 20, wherein the prior operational states of the voltage regulator include first prior operational states and second prior operational states; and
wherein the respective sets of control values include a first set of control values and a second set of control values.

27. The method as in claim 26, wherein the map information maps the first prior operational states of the voltage regulator to the first set of control values, the first set of control values providing a first control response; and
wherein the map information maps the second prior operational states of the voltage regulator to the second set of control values, the second set of control values providing a second control response.

28. The method as in claim 20 further comprising:
obtaining the current samples of operational states of the voltage regulator via sampling multiple operational parameters of the voltage regulator.

29. The method as in claim 28, wherein the current samples of operational settings of the voltage regulator include a respective sequence of multiple data samples for each of the multiple operational parameters of the voltage regulator collected over time.

30. An apparatus comprising:
a voltage regulator operative to convert an input voltage into an output voltage;
a storage resource operative to store map information that provides a mapping between sets of prior operational states of the voltage regulator and sets of control values that control the voltage regulator; and
a controller operative to:
i) receive a set of current operational states of the voltage regulator;
ii) match the received set of current operational states of the voltage regulator to a first set of prior operational states of the voltage regulator, the first set of prior operational states being one of the sets of prior operational states of the voltage regulator;
iii) via the map information, identify a corresponding first set of control values assigned to the first set of prior operational states; and
iv) apply the corresponding first set of control values to the voltage regulator to convert the input voltage into the output voltage.

31. The apparatus as in claim 30, wherein the received set of current operational states of the voltage regulator represent current sampled conditions associated with the voltage regulator; and
wherein the corresponding first set of control values assigned to the first set of prior operational states represents a control response to maintain a magnitude of the output voltage within a desired voltage range for the first set of prior operational states.

32. The apparatus as in claim 30, wherein the current operational states of the voltage regulator represent current operational conditions of the voltage regulator converting the input voltage into the output voltage; and wherein the prior operational states of the voltage regulator indicate previous operational conditions of the voltage regulator detected during a machine learning process, the corresponding first set of control values representing a control response assigned to the prior operational states of the voltage regulator.

33. The apparatus as in claim 32, wherein the corresponding first set of control values include a set of power supply coefficients indicating at least one PID coefficient setting to be applied to the voltage regulator, application of the set of power supply coefficient settings to the voltage regulator operative to maintain the output voltage within a desired voltage range.

* * * * *